United States Patent [19]

Cavicchi et al.

[11] Patent Number: 5,425,816

[45] Date of Patent: Jun. 20, 1995

[54] ELECTRICAL FEEDTHROUGH STRUCTURE AND FABRICATION METHOD

[75] Inventors: Bruce T. Cavicchi, North Hollywood; Anne V. Mason, Los Angeles, both of Calif.

[73] Assignee: Spectrolab, Inc., Sylmar, Calif.

[21] Appl. No.: 751,364

[22] Filed: Aug. 19, 1991

[51] Int. Cl.⁶ .......................................... H01L 31/18
[52] U.S. Cl. .................... 136/256; 136/262; 428/901; 437/3; 437/4; 437/5; 437/195; 437/203; 437/947; 427/97; 174/266
[58] Field of Search ............... 136/256, 262; 437/2–5, 437/947, 195, 203; 428/901; 156/644, 901; 427/96–99; 174/264–266

[56] References Cited

U.S. PATENT DOCUMENTS

| 3,903,427 | 9/1975 | Pack . | |
|---|---|---|---|
| 4,791,248 | 12/1988 | Oldenettel | 174/265 |
| 4,981,525 | 1/1991 | Kiyama et al. . | |

FOREIGN PATENT DOCUMENTS

| 0177686 | 7/1985 | European Pat. Off. . | |
|---|---|---|---|
| WO8905521 | 6/1989 | European Pat. Off. . | |
| 2251984 | 11/1974 | France . | |
| 48-92879 | 12/1973 | Japan . | |
| 54-12376 | 1/1979 | Japan . | |
| 55-67182 | 5/1980 | Japan . | |
| 60-236280 | 11/1985 | Japan . | |
| 61-248496 | 11/1986 | Japan . | |
| 61-292379 | 12/1986 | Japan . | |
| 63-211773 | 9/1988 | Japan | 136/256 |
| 64-82570 | 3/1989 | Japan | 136/256 |
| 1-143388 | 6/1989 | Japan . | |

OTHER PUBLICATIONS

Japanese Patent Abstract (E-508)(2601), vol. 11, No. 154, May 19, 1987.

M. Gillanders et al., "High Efficiency Wraparound Contact Solar Cells", 14th IEEE Photovoltaic Specialists Conference, 1980, pp. 146–150.

K. Matthei, "Optimization of Large Area Solar Cells For Low Cost Space Application", 15th IEEE Photovoltaic Specialists Conference, 1981, pp. 228–232.

D. Michaels et al., "Large Area, Low Cost Space Solar Cells With Optional Wraparound Contacts", 15th IEEE Photovoltaic Specialist Conference, 1981, pp. 225–227.

F. Ho et al., "Thin Foil Silicon Solar Cells With Coplanar Back Contacts", 15th IEEE Photovoltaic Specialist Conference, 1981, pp. 102–106.

B. T. Cavicchi et al., "Large Area Wraparound Cell Development", 17th IEEE Photovoltaic Specialist Conference, 1984, pp. 128–133.

D. Lillington et al., "Development of 8 cm×8 cm Silicon Gridded Back Solar Cell For Space Station", 19th IEEE Photovoltaic Specialist Conference, 1987, pp. 489–493.

D. Lillington et al., "Optimization of Silicon 8 cm×8 cm Wrapthrough Space Station Cells For 'On Orbit' Operation", 20th IEEE Photovoltaic Specialists Conference, 1988, pp. 934–939.

A. Mason et al., "Development of 2.7 MIL BSF and BSFR Silicon Wrapthrough Solar Cells", 21st IEEE Photovoltaic Specialists Conference, 1990, pp. 1378–1382.

Primary Examiner—Donald P. Walsh
Assistant Examiner—Chrisman D. Carroll
Attorney, Agent, or Firm—Elizabeth E. Leitereg; Terje Gudmestad; W. K. Denson-Low

[57] ABSTRACT

In an electrical via structure and fabrication method that is particularly suited to coplanar contact solar cells, an initial opening (38,48a,48b,64) through the substrate is coated and substantially closed with a dielectric material (42,52,80). An inner opening (44) is then formed through the dielectric, and the via is provided with a conductive coating (46,54). The dielectric is initially applied in a liquid state and is thereafter cured to a solid. The need for strong chemical etchants to smooth the via opening prior to application of the dielectric and metallization is eliminated, and a polyimide dielectric on a GaAs/Ge solar cell has resulted in a substantial improvement in leakage resistance and cell efficiency.

16 Claims, 5 Drawing Sheets

ELECTRICAL FEEDTHROUGH STRUCTURE AND FABRICATION METHOD

GOVERNMENT RIGHTS

This invention was made with Government support under Contract No. FC33615-85-C-2635 awarded by the Department of the Air Force. The Government has certain rights in the invention.

BACKGROUND OF THE INVENTION

1. Field of the Invention

This invention relates to the structure and fabrication of electrical feedthroughs, and more particularly to a conductive via structure and fabrication method used to electrically connect the front face of a solar cell to its back face in a coplanar contact configuration.

2. Description of the Related Art

There are a number of applications in which an electrical connection needs to be made through a substrate so that circuitry on one face of the substrate can be electrically contacted by making physical contact to the opposite substrate face. For example, multilayer or 3-D integrated circuit chips can be stacked on top of each other, with circuitry on the upper face of each chip interconnected with circuitry on the other chips by means of conductive vias through the chips. Multilayer photonic devices also make use of electrical feedthroughs through the individual layers. Another example is a solar (photovoltaic) cell in which a voltage differential is developed across the opposite faces of the cell, but it is desired to electrically contact both faces with coplanar contacts made to the back face alone. While the present invention is primarily concerned with a coplanar contact solar cell, it is generally applicable to electrical feedthroughs for other applications also.

A conventional solar cell 2 is illustrated in FIGS. 1 and 2. The cell is formed from a semiconductor material such as silicon, with its front face 4 oriented for illumination by the sun. An abrupt discontinuity in the conductivity type of the cell material is created through the addition of dopants. In the example shown in FIG. 2, the portion of the semiconductor above junction 6 is doped n-type, while the portion below junction 6 is doped p-type. The semiconductor will absorb characteristic photon energies from the visible light spectrum to produce photo-generated electrical carriers, and thus induce a voltage differential between the front face 4 and rear face 8 of the cell.

An electrical connection is made to the front face of the cell by means of conductive leads 10 that extend across the front face and are connected together by a conductive strip 12 along one edge of the cell. This configuration allows sunlight to enter the cell through the areas that are not shaded by the front face conductors; typically about 95% of the front face is exposed. Contact to the rear face 8 is made by means of a metallic sheet 14 which may cover that face.

The voltage developed by the cell can be accessed by making separate electrical contacts to the terminal strip 12 and conductive sheet 14. However, in numerous applications it is desirable that both connections be made to only one side of the cell. For example, in solar arrays for space use in which thousands of cells must be interconnected, the increased complexity of building a coplanar contact cell (both contacts on only one side of tile cell) is more than offset by the reduced assembly cost of the coplanar configuration.

To establish an electrical contact to the front face terminal strip 12 from the rear of the cell, an extension of the terminal strip 12 may be wrapped around the edge of the cell and brought to an area on the back face that is insulated from the conductive sheet 14 and the semiconductor material on that side of the cell. This type of connection, which is referred to as a "wraparound" contact, is disclosed in numerous publications such as M. Gillanders et al., "High Efficiency Wraparound Contact Scalar Cells" 14th IEEE Photovoltaic Specialists Conference, 1980, pages 146-150; K. Matthei, "Optimization of Large Area Solar Cells for Low Cost Space Application", 15th IEEE Photovoltaic Specialists Conference, 1981, pages 228-232; D. Michaels et al., "Large Area, Low Cost Space Solar Cells With Optional Wraparound Contacts", 15th IEEE Photovoltaic Specialists Conference, 1981, pages 225-227; F. Ho et al., "Thin Foil Silicon Solar Cells With Coplanar Back Contacts", 15th IEEE Photovoltaic Specialists Conference, 1981, pages 102-106; and B. T. Cavicchi et al., "Large Area Wraparound Cell Development", 17th IEEE Photovoltaic Specialists Conference, 1984, pages 128-133.

To avoid having to extend a conductive strip around the edge of the cell, a "wrapthrough" connection has been developed recently that makes the connection directly through the cell body. This type of feedthrough arrangement is illustrated in FIG. 3, which shows a portion of the front face for a solar cell that has a radial and concentric circular network of conductor lines 16, rather than the rectangular grid lines 10 of FIGS. 1 and 2. The conductive lines 16 radiate outward from a terminal ring 18 to which they are all electrically connected. An opening or "via" 20 is centrally located within terminal ring 18, and extends down through the cell to the back face. The conductive material of terminal ring 18 extends through via 20 and coats its interior walls to establish an electrical connection between the front face conductor lines 16 and the back face of the cell. A similar via can be provided between the terminal strip 12 and the back face of the cell shown in FIGS. 1 and 2. Such "wrapthrough" vias are disclosed in several articles, such as D. Lillington et al., "Development of 8 cm×8 cm Silicon Gridded Back Solar Cell for Space Station" 19th IEEE Photovoltaic Specialists Conference, 1987, pages 489-493; D. Lillington et al., "Optimization of Silicon 8 cm×8 cm Wrapthrough Space Station Cells for 'On Orbit' Operation" Proceedings of the 20th PVSC, 1988, pages 934-939; and A. Mason et al., "Development of 2.7 mil BSF and BSFR Silicon Wrapthrough Solar Cells" 21st IEEE Photovoltaic Specialists Conference, 1990, pages 1378-1382.

An example of a prior "wrapthrough" via is shown in FIG. 4. An active solar cell region 22 is formed on a doped semiconductor substrate 24 that electrically functions as a conductor to bring the voltage developed on the underside of the active region to the cell's back face 26. A via opening 28 is established through the substrate, normally by laser scribing. A dielectric layer 30, typically $SiO_2$, is deposited over the via walls and the adjacent front and back surfaces of the cell by low pressure chemical vapor deposition. A conductive metallic layer 32 is then deposited over the $SiO_2$ layer 30, and extends beyond the dielectric on the front face of the cell to establish electrical contact with that portion of the active region. The conductive layer 32 is insulated from the substrate on its back face, but is exposed at that location so that it may be contacted coplanar with back face contact (not shown).

It is important that the exposed substrate surface which contacts the $SiO_2$ coating in the via opening be quite smooth, as illustrated on the left hand side of the via 28. If the substrate surface is rough it may not be completely covered by the $SiO_2$ layer. In this event the conductive metal 32 can come near or into direct contact with the substrate, resulting in a significant power loss and perhaps even short-circuiting the device entirely.

A problem with laser scribing via openings through semiconductors such as silicon and germanium is that the scribing operation produces an opening whose surface is quite rough. An aggressive etch is then typically employed to smooth the walls of the opening. Omitting the etch can result in the formation of pinholes or cracks in the $SiO_2$ layer, resulting in the shunting of current into the substrate.

Solar cells have recently been developed with GaAs active regions on a Ge substrate. While these materials offer a higher conversion efficiency than silicon, GaAs is attacked by the strong etchants used to smooth the via walls, and must be isolated from the etchant by a protective mask. Unfortunately, it is difficult to fully mask the GaAs active region, and damage often results from the etching process. In theory this problem can be overcome by reversing the fabrication process, and forming the via through the Ge substrate before the GaAs active region is grown. But the process of forming the via often results in damage to the upper Ge surface so that a good epitaxial growth of GaAs upon the substrate surface cannot be achieved.

The degree to which cell performance is degraded by this type of limited shorting, shown on the right hand side of FIG. 4, is a function of the shunt resistance value, the operating voltage and the cell area. Based upon modeled results for GaAs/Ge cells, minimum shunt resistances of 400 ohms and 6,000 ohms are required to hold losses to less than 0.5% for cells with areas of 16 cm$^2$ and 1 cm$^2$, respectively. The conventional via structure described above is not capable of reliably meeting this requirement. Furthermore, dielectrics such as $SiO_2$ that are deposited by low pressure chemical vapor deposition have poor adhesion to Ge.

SUMMARY OF THE INVENTION

In view of the above problems, the present invention seeks to provide a new via structure and fabrication method that substantially increases the via's shunt resistance and thus reduces power losses and eliminates the danger of shorting, eliminates the need for chemical etching to smooth the via surface in the substrate and thus allows the active region of a solar cell to be grown prior to forming the via, and exhibits good adhesion between the dielectric and both the substrate and the via metallization.

These goals are achieved with a new via fabrication process in which a first opening is initially made through the substrate, the first opening is coated and substantially closed with a dielectric material, and a second opening is then formed through the dielectric. A coating of conductive material that extends between the opposed sides of the substrate is thereafter deposited over the dielectric, which insulates it from the substrate.

The dielectric preferably comprises a material that is liquid in its uncured state, but is curable to a solid. The dielectric is first applied in its liquid state, and is thereafter cured. A partial cure may be performed prior to the formation of the opening through the dielectric, with the dielectric fully cured thereafter. For a GaAs/Ge solar cell, a polyimide is preferred for the dielectric because of its superior adhesion to Ge and high temperature stability.

To promote a complete closing of the initial via opening when the dielectric has less than optimum viscosity, the via opening may be formed with bevel profiles on each side interconnected by a narrower passageways. The dielectric thickness is substantially greater in the passageway than in the beveled areas removed from the passageway. The invention allows the opening through the dielectric to be made substantially smoother than the initial via opening through the substrate, and in the case of a GaAs/Ge solar cell permits the GaAs active region to be epitaxially grown upon the Ge base prior to forming the via. As the new via structure eliminates the need for a chemical etch to smooth the surface of the initial via opening, unintended damage to the active region from etchant leakage is likewise eliminated. The new via structure also substantially increases the resistance of the via to current leakage, and thereby improves the cell's efficiency.

These and other features and advantages of the invention will be apparent to those skilled in the art from the following detailed description, taken together with the accompanying drawings, in which:

DETAILED DESCRIPTION OF THE INVENTION

The present invention takes a significant departure from the conventional approach to forming vias. Rather than simply forming a dielectric coating over a via opening to insulate the conductive layer from the substrate, it fully or partially encapsulates the via opening, closing it off. A new, narrower opening is then formed through the dielectric, and this provides the base for the conductive coating. The encapsulation approach allows for thicker dielectric layers that obviate the problems of rough via walls, and broadens the range of dielectric materials that may be used to include materials with better adhesion and insulating properties for the particular application.

Figure 1:
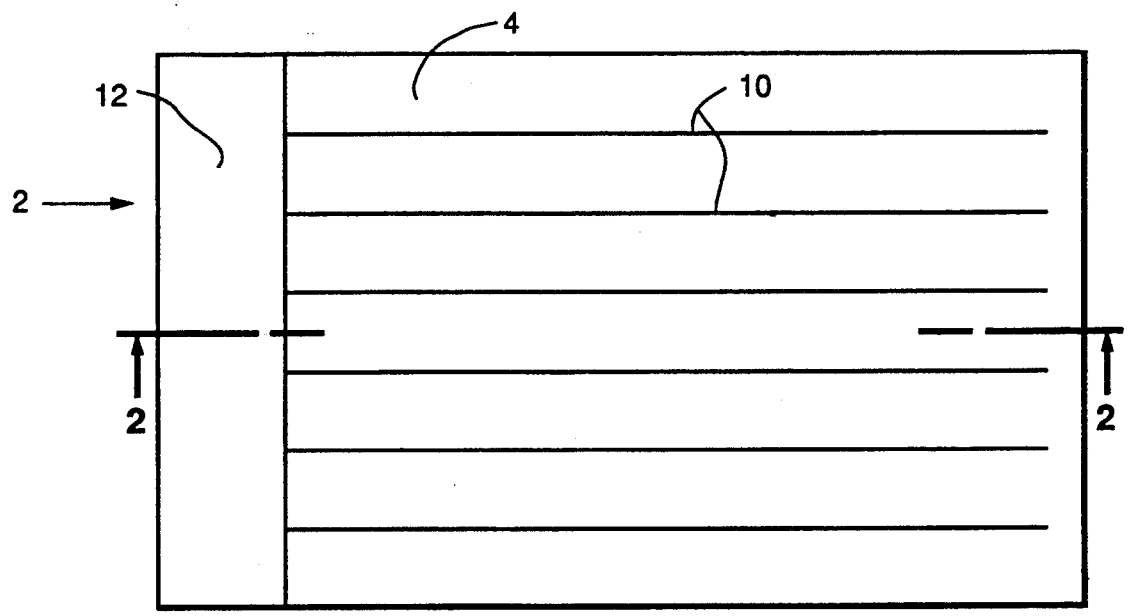
FIG. 1 is a plan view of a conventional solar cell.
Figure 2:
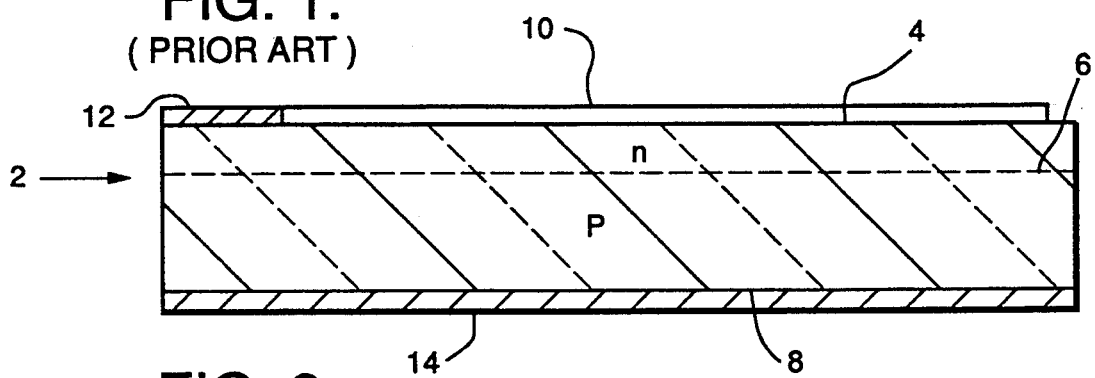
FIG. 2 is a sectional view taken along the line 2—2 of FIG. 1.
Figure 3:
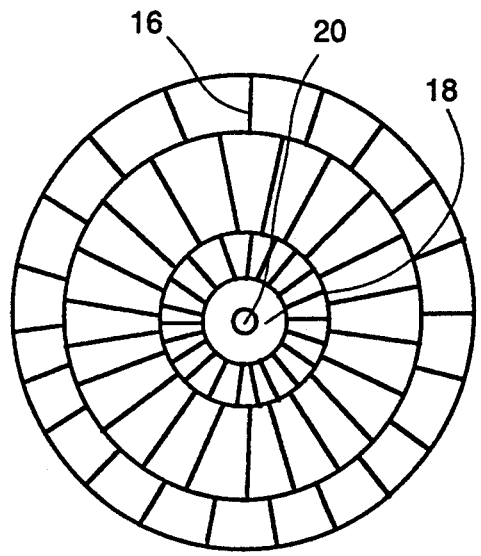
FIG. 3 is a plan view of a section of another conventional solar cell in which a via feedthrough interconnects the front surface with the rear of the cell.
Figure 4:
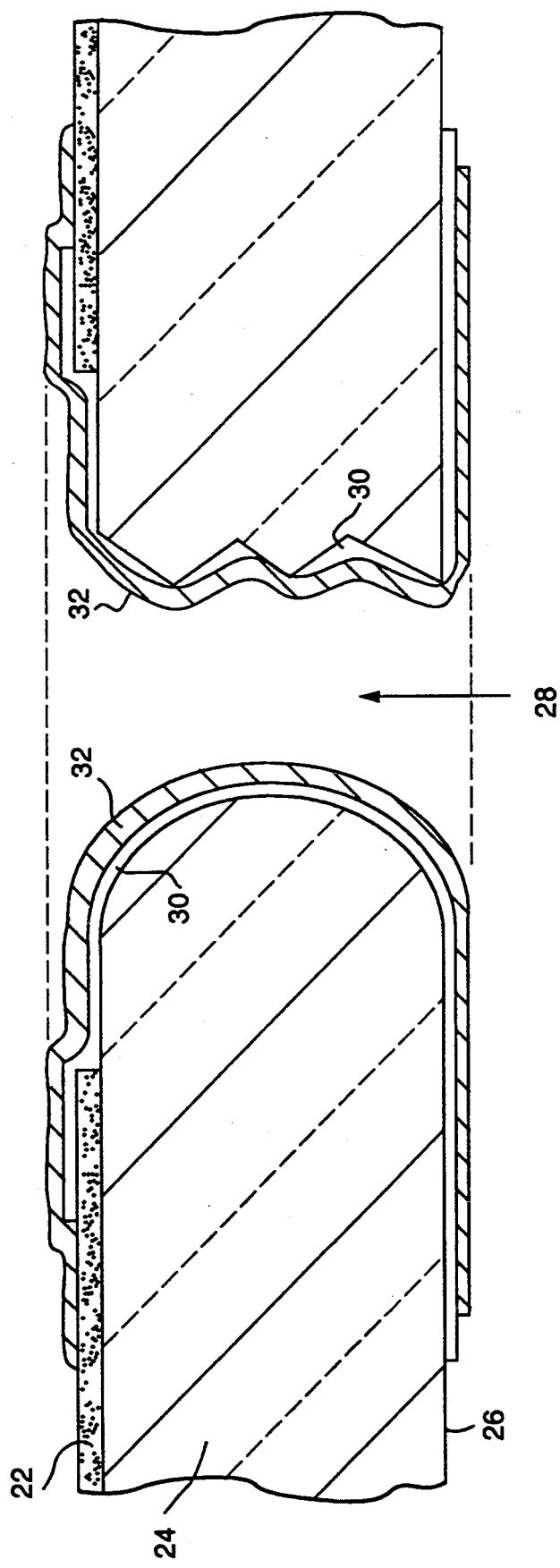
FIG. 4 is a sectional view of a conventional via construction.
Figure 5A:
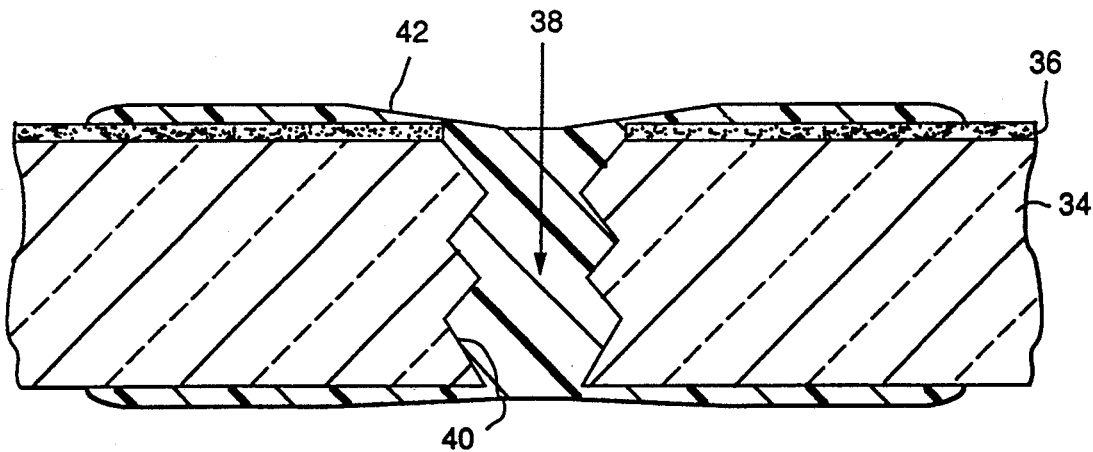
FIGS. 5a, 5b and 5c are sectional views illustrating sequential steps in the formation of an improved via structure in accordance with the invention.
Figure 5B:
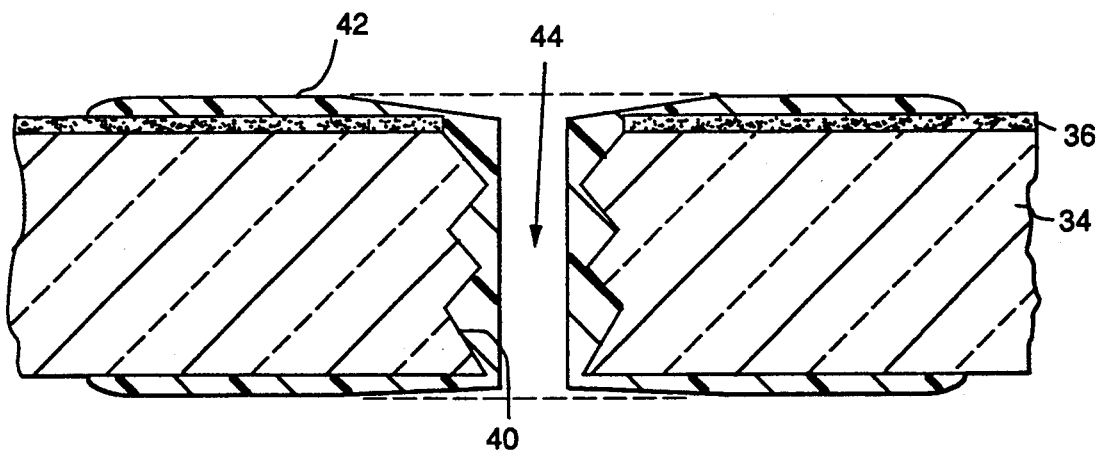
Figure 5C:
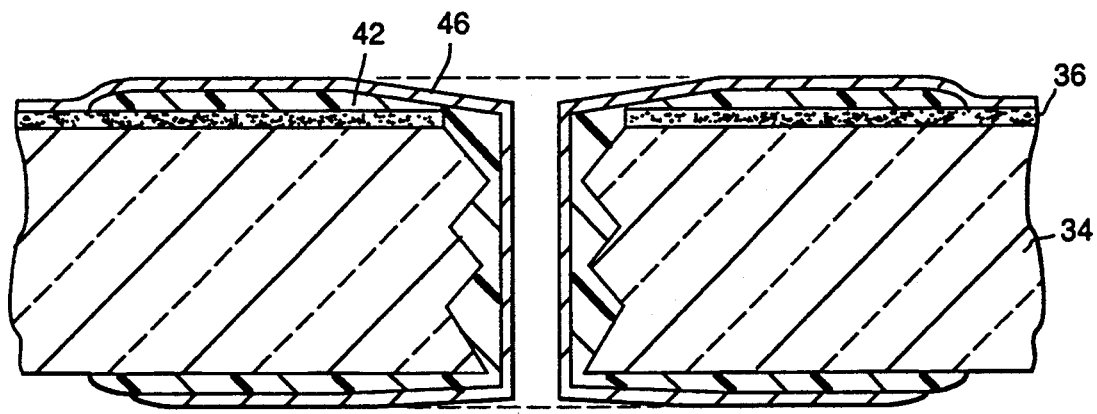

The fabrication process for one embodiment is illustrated in FIGS. 5a–5c. A solar cell is shown, but the invention is also applicable to other types of electrical circuit packages in which a feedthrough is needed between opposed faces.

A solar cell substrate 34 is shown with an active layer 36 grown on its upper (front) surface. A via opening 38 of a conventional type is formed through the substrate, either mechanically by grinding or drilling, or by a laser scribe technique in which the substrate stage is moved under a pulsed YAG laser to produce a via opening of the desired size and shape. The via walls 40 can be quite rough (the roughness is exaggerated in the drawing), as in conventional vias.

At this point, rather than using a strong chemical etchant to smooth the via walls, the rough opening is encapsulated with a dielectric material 42 that closes off the opening and extends out over the surface of the substrate on either side. To achieve this encapsulation the dielectric is preferably a liquid that can be cured to a solid form after it has been applied to the via opening. The liquid dielectric can be metered onto the via in drops from either side, screen printed, or coated over the entire cell by dipping and then photolithographically removed except in the vicinity of the via. An additive process such as applying the dielectric with a dropper only where it is needed is generally preferable, since it requires fewer fabrication steps than the photolithographic patterning necessary for a subtractive process in which the dielectric coats the entire substrate and is then removed except in the desired areas. The latter process would generally require the depositing of photoresist over the desired dielectric areas on the front and back of the substrate, followed by dipping the substrate in a developer to remove the exposed dielectric, and then washing off the photoresist.

It has been found that a polyimide is generally preferable as the dielectric material, particularly for a GaAs/Ge solar cell. Polyimides require only a conventional baking process for curing into a solid, exhibit good adhesion to Ge, and can be photolithographically patterned if that type of application is desired. A suitable polyimide is DuPont PI-2610D, which is stable up to about 600° C.

Other curable liquid dielectrics that can conform to the substrate shape and close off the via opening could also be used, although they often have one or more practical limitations to their use. For example, various types of epoxies could be applied by a dropper or screen printing, but there are problems associated with their coefficients of thermal expansion, and with thermal and environmental instability. In the next step of the fabrication process a second, narrower opening 44 is formed through the dielectric material 42 inward of the via opening 40. The dielectric material is partially cured to facilitate the removal of dielectric from the substrate except in the vicinity of the via, if the dielectric is initially applied by dipping. Then it is fully cured in a final bake sequence after the unwanted portions are removed but before the inner opening 44 is formed. If the dielectric is applied by an additive process such as dropper application or screen printing, it can be fully cured in a single step prior to formation of opening 44.

As with the initial via opening 38, laser scribing can be used to form the inner opening 44. When a polyimide is used for the dielectric material, it has been found that laser scribing produces an opening with much smoother walls than for the semiconductor substrate 34. The thickness of the dielectric within the via opening 38 will depend in part upon the diameter of the initial via opening 38 (typically about 0.25–0.5 mm) and the ability of the dielectric material to encapsulate the open area without excessive thinning. In any event, the dielectric thickness within the via opening 38 is made substantially greater than the typical 1 micron thickness of the dielectric layer deposited by chemical vapor deposition in previous via structures. The achievement of this greater dielectric thickness provides assurance against pinholes or other low resistance areas across the dielectric.

The final step in the formation of the via is illustrated in FIG. 5c. A metallization layer 46 is deposited onto the surface of the dielectric 42, typically by a conventional evaporation process. On the back face of the substrate the metallization 46 extends out over the dielectric but terminates short of the substrate's back surface, thus preventing any shorting between the metallization and the back surface. Although not shown in FIG. 5c, the dielectric would generally be extended over an additional portion of the back substrate surface on one side of the via to provide a landing for a via contact pad.

On the substrate's front surface the via metallization 46 extends over and beyond the dielectric to make electrical contact with the front face of active layer 36. For this purpose, the metallization 46 is preferably formed integrally with the terminal strip or ring and the conductor network on the front surface in a single evaporation step, thus simplifying the fabrication process. In this manner the voltage signal developed at the cell's front surface is brought through the cell by the via metallization to the back surface, where it is available for coplanar contacting along with the back surface potential.

Figure 6:
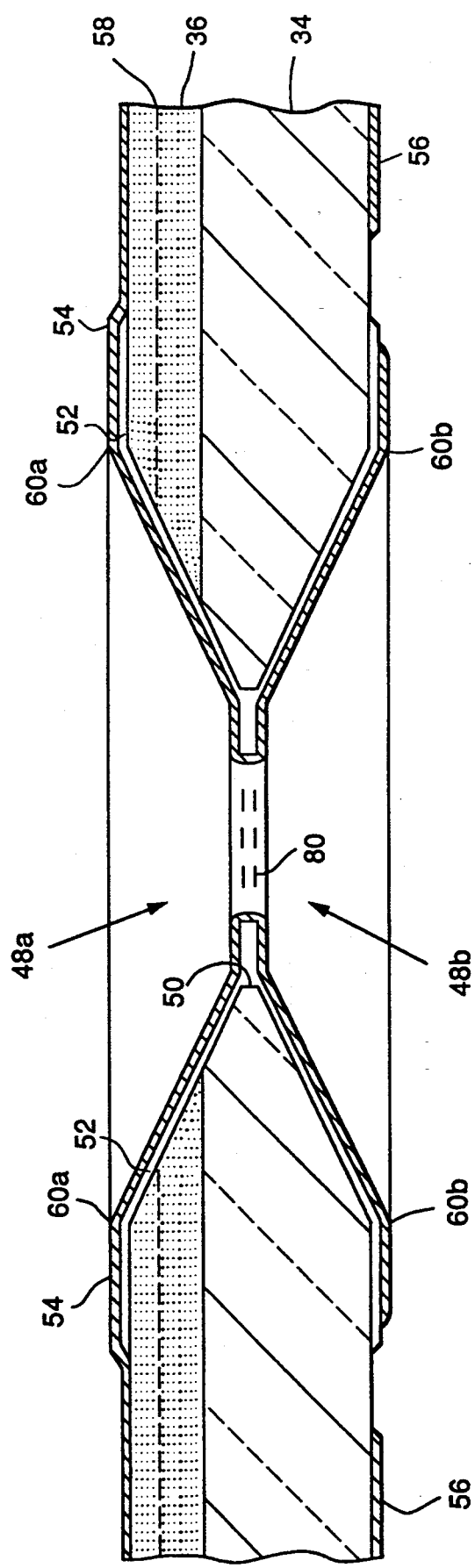
FIG. 6 is a sectional view of an alternate via structure in accordance with the invention.

While a complete encapsulation of the via opening as illustrated in FIG. 5a is considered to be the ideal situation, in practice the dielectric material may not be sufficiently viscous for particular via dimensions, and the dielectric may tend to thin out within the via opening. In this case, an alternate via geometry as illustrated in FIG. 6 may advantageously be employed. In this embodiment the thickness of the active region 36 relative to substrate 34 is exaggerated for purposes of illustration. The via consists of two beveled openings 48a and 48b which extend into the cell from its opposite sides. The beveled openings are coaxial and spaced somewhat away from each other, with a narrower axial passageway 50 joining them. A dielectric layer 52, preferably polyimide for a GaAs/Ge cell, coats the walls of the via opening and extends out over the front and back cell faces somewhat. A metallization layer 54 extends over the dielectric layer to make contact with the active cell region 36 on the front face, and terminates on the dielectric layer short of the exposed substrate surface on the back face. Metallization 54 is typically about 5 microns thick. A back contact sheet 56 is shown surrounding and spaced from the dielectric layer 52, although in theory the back contact sheet 56 could extend right up to the edge of dielectric 52 so long as it avoided electrical contact with the via metallization 54. The junction between the n-type and p-type doped portions of active region 36 is indicated by numeral 58.

The arrangement of FIG. 6 has the advantage that it can be formed with a dielectric such as polyimide that is not sufficiently viscous to fully encapsulate a via of conventional dimensions, and yet offers significant advantages in isolating the voltage on via metallization 54 from the substrate. When applied either by dipping or drop application, the polyimide thickness in the bevel area can be at least about 2 microns, which is twice the thickness used with the prior chemical vapor deposition of SiO$_2$. The thickness of SiO$_2$ is typically limited by tensile stresses that can lead to cracking and subsequent short formation at thicknesses greater than 1 micron. At the junctions 60a and 60b between the beveled openings and the front and back cell faces, respectively, the dielectric forms an obtuse angle that is significantly less subject to cracking, and thus to resistance breakdown, than prior vias in which the angle is much closer to perpendicular.

The outer diameters of the beveled openings 48a, 48b will generally be about 1–1.5 mm, the diameter of the interior substrate opening bounded by substrate wall 50 will generally be about 0.5 mm, and the diameter of the inner passageway through the dielectric 52 between the two beveled openings will generally be about 0.25 mm. Thus, the entire via structure can be fabricated to occupy less cell area than prior vias, and yet provides a more reliable electrical isolation between the front and back cell faces.

Figure 7:
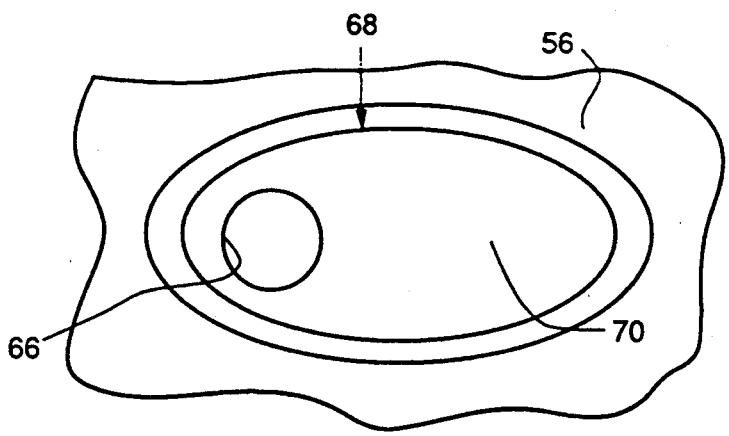
FIG. 7 is a plan view showing a portion of the back surface of a solar cell with a via contact pad.

A plan view of the rear cell face in the via vicinity, for the embodiments of either FIGS. 5a–5c or FIG. 6, is shown in FIG. 7. The back via opening 66 is surrounded by the via metallization 68, which extends through the via and expands along the back side of the cell into a contact pad 70. All of the back via metallization, including the contact pad 70, is insulated from the back cell surface by the dielectric layer (not shown). The back face metallic contact sheet 56 surrounds the via metallization, but is spaced back from the metallization to avoid any electrical contact with it. A back cell contact can be formed at any convenient location on the back face sheet 56.

Figure 8:
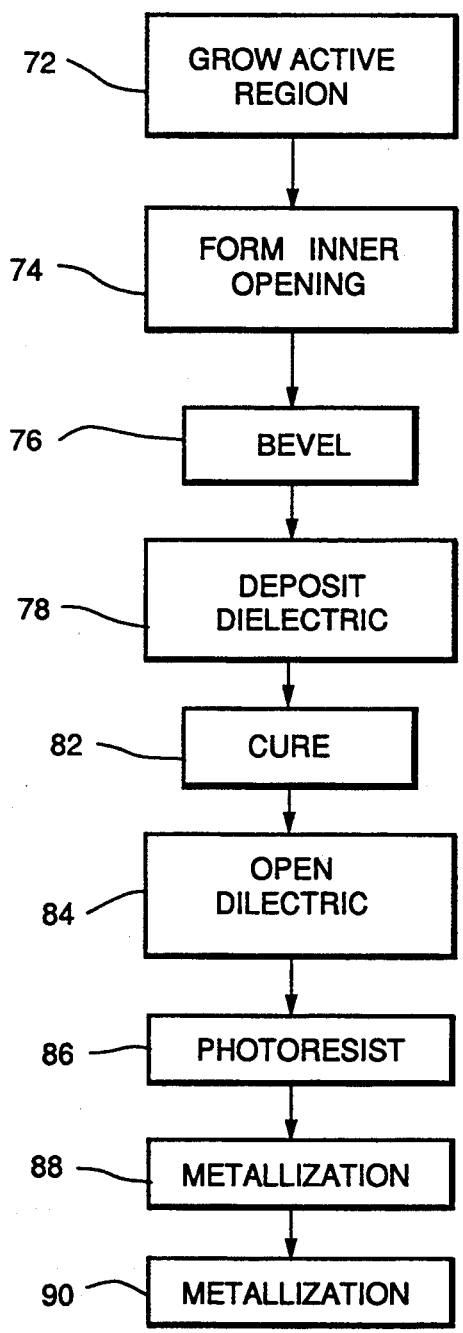
FIG. 8 is a flow diagram of a via fabrication technique in accordance with the invention.

FIG. 8 is a process flow diagram that summarizes a fabrication technique for the beveled via structure shown in FIG. 6. In the first step 72 the active region is grown upon the semiconductor substrate and doped to establish the basic photocell. In the case of a GaAs/Ge cell the active region may then be masked if desired. However, this is normally not necessary because no smoothing of the via opening, with the attendant aggressive etchants, is required. At this time the substrate may also be thinned if desired to reduce the final cell weight.

The inner opening 50 is next formed through the entire cell, including both the active layer and substrate, in step 74. It is formed either by mechanically grinding or drilling, or by laser scribing. A round cutting head is then used to produce a bevel on each side of the cell, connected by the inner opening 50, in step 76. If a mask has previously been formed over the active layer, it would be removed when the bevels have been completed. The dielectric is next deposited over the via opening in step 78. As described above, this can be performed either by dripping, dropper application, screen printing or in some other convenient manner. When the dielectric is initially deposited it bridges entirely across the inner opening to close the via. This is indicated by dashed lines 89 in FIG. 6. The dielectric is then cured in step 82, followed by the formation of an opening through the dielectric bridge in step 84. This opening is preferably established in a laser scribe operation with a laser focused to about 0.025 mm, and as described above is used to produce a dielectric opening about 0.25 mm in diameter.

The via metallization is next laid down. This is performed by first covering the entire cell, except for those areas in which the metallization is desired, with a layer of photoresist in step 86. The photoresist pattern preferably exposes areas for both the front and back contact metallizations at the same time as the via metallization. The metal is then evaporated onto the cell in step 88, followed by lifting off the photoresist and the overlying metallization in step 90.

The functional solar cell is now complete. If multiple cells have been formed on a common wafer, the individual cells are now diced and tested.

In the process just described, the active region is grown prior to formation of the via opening, without having to worry about protecting the active region from chemical etchants previously used to smooth the via opening. Alternately, the active region could be grown after the via has been formed. In this case it would generally be desirable to mask the substrate surface to prevent damaging it during the via processing. Such a mask need provide only mechanical protection for the substrate surface, since there are no strong etchants used which can degrade the mask.

The resulting via structure results in a substantial improvement in leakage resistance, compared to prior coplanar contact solar cell designs. With the via design of FIG. 6 and a GaAs/Ge cell with a polyimide coating about 2 microns thick in the beveled areas, average efficiencies of about 17% and a peak efficiency of about 18.5% were measured at AM (air mass) zero, 28° C. As far as applicants are aware, the only prior GaAs/Ge coplanar contact solar cells constructed have been by Applied Solar Energy Corporation, and these involved wraparound rather than "wrapthrough" connections-between the front and back surfaces. The efficiencies of these devices are believed to have been in the 15%–16% range.

The measured leakage resistance of applicants' test devices averaged 2 megohms, which is much greater than the 300 ohms resistance typical of conventional vias. The lowest measured resistance value of the test devices was 360 ohms, which is still high enough to maintain losses at less than 0.7%. The test devices were also found to have a high mechanical integrity and substantially greater than average pull strength for welded on copper tabs.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating an electrical via through a GaAs/Ge solar cell, said solar cell having a substrate with opposed sides, comprising:

epitaxially growing a GaAs active region upon a Ge base to establish said substrate prior to formation of the via, forming a first opening through said substrate, coating and substantially closing said first opening with a dielectric material, forming a second opening of smaller size than the first opening through said dielectric material, and coating said dielectric material with a conductive material that extends between the opposed sidles of said substrate, said conductive material being insulated from the substrate by said dielectric material.

2. The method of claim 1, wherein said via is formed without the use of smoothing etchants for said first opening that are harmful to the GaAs active layer.

3. A method of fabricating an electrical via through a solar cell with a GaAs active region on a Ge base, said solar cell comprising a substrate with opposed sides, comprising:

forming a first opening through said substrate, coating and substantially closing said first opening with a polyimide dielectric material, forming a second opening of smaller size than the first opening through said dielectric material, and coating said dielectric material with a conductive material that extends between the opposed sides of said substrate, said conductive material being insulated from the substrate by said polyimide dielectric material.

4. A method of fabricating an electrical via through a solar cell that comprises a substrate having front and back faces on opposed sides, comprising:

forming a first opening through said substrate, coating and substantially closing said first opening with a dielectric material, forming a second opening of smaller size than the first opening through said dielectric material, coating said dielectric material witch a conductive material that extends between the opposed sidles of said substrate, said conductive material being insulated from the substrate by said dielectric material, forming a front electrical contact layer contacting said front face simultaneously with the formation of said conductive coating and as a unitary conductive layer with said conductive coating, and forming a back electrical contact layer contacting said back face.

5. An electrical feedthrough package comprising:

a substrate having opposed sides, a via opening through the substrate between its opposed sides, a dielectric coating on the walls of said via opening, said dielectric coating comprising the solid cured form of a material that is liquid in its uncured form, and a conductive coating on said dielectric coating that is electrically insulated from said substrate by said dielectric coating, and provides electrical interconnection between the opposed sides of said substrate, wherein said via opening, dielectric coating and conductive coating have respective bevel profiles facing said opposed substrate sides, said bevel profiles are spaced coaxially away from each other, said dielectric and conductive coatings extend between said bevel profiles through an inner opening in the substrate that is substantially narrower than the widths of said bevel profiles in the vicinity of said opposed substrate sides, and the thickness of said dielectric coating is substantially greater in said inner opening than in said bevel profiles.

6. A coplanar contact solar cell, comprising:

a cell having opposed front and back faces, said cell being formed from a semiconductor material that has a junction for generating a voltage between said opposed faces in response to solar illumination, back electrical contact means contacting said back face, front electrical contact means contacting said front face, and an electrical feedthrough extending said front electrical contact means to said back face to enable coplanar electrical contacting of said front and back faces, said electrical feedthrough comprising:

a via opening through said cell between said front and back faces, said via opening being bounded by a cell wall that has a relatively rough surface, a dielectric coating on the walls of said via opening, said dielectric coating having an inner wall facing the interior of the via opening, the surface of said inner wall being smoother than the surface of the cell wall that bounds the via opening, a conductive coating on said dielectric coating that is electrically insulated from said cell by said dielectric coating, electrically connected to said front electrical contact means, and electrically insulated from said back electrical contact means, and means on said back cell face for establishing an electrical contact to said conductive coating.

7. The coplanar contact solar cell of claim 6, said cell being formed from GaAs on Ge, and said dielectric coating comprising a polyimide.

8. The coplanar contact solar cell of claim 6, one side of said junction being associated with the front face of the cell and the other side of the junction being associated with the back face of the cell, wherein said dielectric coating shields said conductive coating from said junction so that the conductive coating is electrically connected only to the side of the junction associated with the front face of the cell.

9. The coplanar contact solar cell of claim 8, said junction extending to the front face of the cell adjacent said via opening, wherein said dielectric coating extends over said junction where it meets the front cell face, and said conductive coating extends over said dielectric coating to said front electrical contact means.

10. The coplanar contact solar cell of claim 6, said back electrical contact means being spaced from said via opening, said dielectric coating extending over said back face toward said back electrical contact means, and said conductive coating extending over said dielectric coating extension on the back face and insulated thereby from said back face.

11. The coplanar contact solar cell of claim 6, said via opening, dielectric coating and conductive coating having respective bevel profiles opening onto said front and back faces.

12. The coplanar contact solar cell of claim 11, wherein said bevel profiles are spaced coaxially away from each other, said dielectric and conductive coatings extending between said bevel profiles through an inner opening in the cell that is substantially narrower than the widths of said bevel profiles in the vicinity of said front and back faces.

13. The coplanar contact solar cell of claim 6, wherein said dielectric coating is at least about 2 microns thick.

14. The coplanar contact solar cell of claim 6, said dielectric coating comprising the solid cured form of a material that is liquid in its uncured form.

15. A coplanar contact solar cell comprising:

a cell having opposed front and back faces, said cell being formed from a semiconductor material that has a junction for generating a voltage between said opposed faces in response to solar illumination, back electrical contact means contacting said back face, front electrical contact means contacting said front face, and an electrical feedthrough extending said front electrical contact means to said back face to enable coplanar electrical contacting of said front and back faces, said electrical feedthrough comprising:

a via opening through said cell between said front and back faces, a dielectric coating on the walls of said via opening, said dielectric coating comprising the solid cured form of a material that is liquid in its uncured form, a conductive coating on said dielectric coating that is electrically insulated from said cell by said dielectric coating, electrically connected to said front electrical contact means, and electrically insulated from said back electrical contact means, and means on said back cell face for establishing an electrical contact to said conductive coating, wherein said via opening, dielectric coating and conductive coating have respective bevel profiles opening onto said front and back faces, said bevel profiles are spaced coaxially away from each other, said dielectric and conductive coatings extend between said bevel profiles through an inner opening in the cell that is substantially narrower than the widths of said bevel profiles in the vicinity of said front and back faces, and the thickness of said dielectric coating is substantially greater in said inner opening than in said bevel profiles.

16. A method of fabricating an electrical feedthrough through a coplanar contact solar cell, said solar cell comprising:

a cell having opposed front and back faces, said cell being formed from a semiconductor material that has a junction for generating a voltage between said opposed faces in response to solar illumination, back electrical contact means contacting said back face, and front electrical contact means contacting said front face, said method comprising:

forming a via opening through said cell between said front and back faces, coating the wall of said via opening with an uncured liquid dielectric material, curing said dielectric coating to a solid, forming a conductive coating on said cured dielectric coating so that the conductive coating is electrically insulated from said cell by said dielectric coating, electrically connected to said front electrical contact means, and electrically insulated from said back electrical contact means, and establishing an electrical contact between said back cell face and said conductive coating to complete an electrical contact between said front and back faces, wherein the wall of said dielectric coating facing said conductive coating is formed smoother than the wall of said via opening.

* * * * *